US005182485A

United States Patent [19]

de la Fonteijne

[11] Patent Number: 5,182,485

[45] Date of Patent: Jan. 26, 1993

[54] ULTRASONIC TRANSDUCER COMPRISING AT LEAST ONE ROW OF ULTRASONIC ELEMENTS

[75] Inventor: Marcel R. de la Fonteijne, Delft, Netherlands

[73] Assignee: B.V. Optische Industrie "De Oude Delft", Delft, Netherlands

[21] Appl. No.: 623,393

[22] PCT Filed: Jun. 28, 1989

[86] PCT No.: PCT/EP89/00739

§ 371 Date: Nov. 19, 1990

§ 102(e) Date: Nov. 19, 1990

[87] PCT Pub. No.: WO90/00792

PCT Pub. Date: Jan. 25, 1990

[30] Foreign Application Priority Data

Jul. 13, 1988 [NL] Netherlands ........................ 8801776

[51] Int. Cl.[5] ............................................ H01L 41/08

[52] U.S. Cl. .................................... 310/334; 310/367

[58] Field of Search ................................ 310/334–336, 310/367

[56] References Cited

U.S. PATENT DOCUMENTS

| | | | |
|---|---|---|---|
| 4,242,912 | 1/1981 | Burckhardt et al. | 310/334 X |
| 4,425,525 | 1/1984 | Smith et al. | 310/336 |

*Primary Examiner*—Mark O. Budd

*Attorney, Agent, or Firm*—Louis E. Marn

[57] ABSTRACT

An array comprising at least one row of ultrasonic elements when energized generates a pressure pattern having side lobes when viewed in the lateral direction. Those side lobes give rise to undesirable grating lobes. The side lobes in both transverse and lateral direction can be suppressed by having identical and identically arranged ultrasonic elements (14) the width of which, viewed in the lateral direction, is greater than the pitch of the consecutive ultrasonic elements in the row.

4 Claims, 1 Drawing Sheet

ULTRASONIC TRANSDUCER COMPRISING AT LEAST ONE ROW OF ULTRASONIC ELEMENTS

Figure 1:
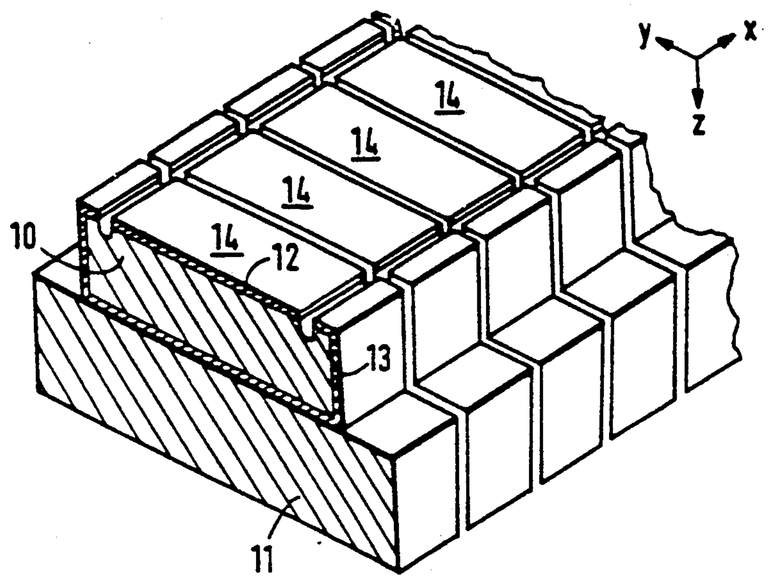

The invention relates to an ultrasonic transducer comprising at least one row of ultrasonic elements, in which transverse side edges of consecutive elements extend obliquely with respect to the lateral centre axis of the row.

Such an ultrasonic transducer comprising a row of ultrasonic elements, hereinafter to be called the "array", is known from U.S. Pat. No. 4,425,525. When such arrays are used for examination with the aid of ultrasonic vibrations, for example medical examination, it is a problem that each of the elements in the array delivers, when driven, a pressure pattern which has a main lobe and a number of side lobes. Said side lobes are not only present when the pressure pattern is examined parallel to the longitudinal axis of the array, the lateral axis, but also in the direction perpendicular thereto, the transverse direction. Said side lobes may have a relatively high intensity with respect to the main lobe and seriously hamper the interpretation of an ultrasonic echo image obtained with the aid of the array.

In the known array, it is proposed to give each of the subelements the shape of a diamond, the ends of the diamond, viewed along the transverse axis of each of the elements, being flattened off. With the aid of elements shaped in this way, in which the width of each element, viewed from the lateral centre axis of the array towards the two longitudinal side edges thereof, thus gradually decreases, a pressure pattern whose side lobes are appreciably suppressed is obtained in the transverse direction of the array. A drawback of the known array is, however, that the side lobes of the pressure pattern, viewed in the lateral direction, are not suppressed at all. In an array of ultrasonic elements, such side lobes result in interference of the side lobes of adjacent elements, as a result of which so-called "grating lobes" are produced which may affect the pressure pattern very disadvantageously because such grating lobes may, under certain circumstances, be as intense as the main lobe. It is a technique known per se to suppress such grating lobes to a certain degree by dividing up the elements by saw cuts into subelements ("sub-dicing"), a specific ratio between the width of the saw cuts and the width of the subelements being chosen for the best possible suppression of the grating lobes with this technique. In order to obtain a better suppression of the grating lobes, it is desirable to deal with the cause thereof, the presence of side lobes in the pressure pattern of each of the elements.

The invention offers a solution for achieving this by providing an ultrasonic transducer of the type mentioned in which the total extension (2*a*) of each of the ultrasonic elements (14*b*, 14*c*, 14*d*) in the lateral direction is greater than the distance (p) between the central points of the consecutive elements on the lateral centre axis (x) of the row.

As a result of the measure according to the invention, it has proved possible, as will be explained in more detail below, to suppress the side lobes in the pressure pattern both in the transverse direction and also in the lateral direction so that said side lobes, and in particular the grating lobes which are produced therefrom by interference, do not affect the analysis of the ultrasonic echo image disadvantageously.

It is pointed out that it is known from German Patent Specification 3,304,666 to suppress the side lobes of the elements of an ultrasonic transducer. For this purpose, in the longitudinal direction of the array, towards the two ends of the array, elements are used which are gradually ever less intensely polarized, as a result of which the elements in the centre of the array make the greatest contribution to the beam. This solution is, however, cumbersome because elements having a mutually differing degree of polarization have to be used.

The invention will be explained in more detail below on the basis of an exemplary embodiment with reference to the drawing. In the latter:

FIG. 1 shows a diagrammatic view in perspective of a known ultrasonic array;

FIGS. 2*a, b, c* and *d* show a plan view of a known configuration of ultrasonic elements and in plan view three configurations of ultrasonic elements according to the invention for use in an array according to FIG. 1.

FIG. 1 shows a conventional ultrasonic array comprising a bar of piezoelectric ceramic material 10 from which the actual ultrasonic elements are formed. This bar is mounted in a manner known per se on a carrier 11. Deposited on the top of the bar 10 is an electrode layer 12 and on the bottom an electrode layer 13. In the array shown in FIG. 1, the separate ultrasonic elements are formed by sawing through the bar 10 having the two electrode layers and the carrier 11 at mutually equal distances, as a result of which a large number of individual, essentially identical ultrasonic elements 14 are formed, each having an upper electrode 12 and a lower electrode 13. An ultrasonic array can be formed in a manner known per se from this large number of ultrasonic elements.

In the array shown in FIG. 1, the ultrasonic elements have a rectangular shape in plan view, as FIG. 2*a*, which shows three of the elements 14 from the array according to FIG. 1, also indicates. The FIGS. 2*b, c, d* show, in plan view, shapes of three consecutive ultrasonic elements according to the invention in each case in an array, which ultrasonic elements are respectively indicated by 14*b*, 14*c* and 14*d* and which, in contrast to the known ultrasonic elements 14 according to FIG. 2*a*, generate a pressure pattern whose side lobes are always suppressed to an appreciable extent with respect to the main lobe so that the production of grating lobes in the pressure pattern of the total array can also largely be suppressed.

The invention is based on the insight that an appreciable suppression of the side lobes in the radiation pattern of an ultrasonic element, both in a direction parallel to the longitudinal axis of the array and in the direction perpendicular thereto, can be obtained if the pitch of the consecutive elements in the array is smaller than the width of each of the elements. In FIG. 2*b*, each of the ultrasonic elements 14*b* has the shape of a wing, the element width being indicated by 2*a*; the element height by 2*b*; the angle between the first pair of side edges on either side of the longitudinal axis by $2\alpha$ and the angle between the second pair of side edges on either side of the longitudinal axis by $2\beta$. The pitch between the consecutive elements 14*b* in the row is indicated by p.

The shapes shown in FIGS. 2*c* and 2*d* of the ultrasonic elements according to the invention, 14*c* and 14*d* respectively, essentially form variants of the embodiment according to FIG. 2*b*. The dimensions and the angles are indicated in FIGS. 2*c* and 2*d* by the same reference numerals as in FIG. 2*b*. For the embodiment according to FIG. 2*c*, it holds true that $2\alpha=2\beta$, while for the embodiment according to FIG. 2*d*, the limits of the ultrasonic elements parallel to the longitudinal axis of the array have a length equal to 0. For the embodiment according to FIGS. 2*c* and 2*d*, it also holds true that the element width 2*a* is larger than the pitch p between the consecutive elements.

In practice it has been found that, for the embodiment according to FIG. 2*c*, a good suppression of the side lobes in the pressure pattern can be obtained if it holds true that $2\alpha=2\beta\approx140°$. For the embodiment according to FIGS. 2*b* and 2*d*, it holds true that $2\alpha<2\beta<180°$ in order to be able to satisfy the requirement $2a>p$.

In using the ultrasonic elements 14*b*, 14*c* or 14*d* in a linear array transducer as shown in FIG. 1, it is obviously possible to build up a transducer by placing a number of arrays next to each other in the transverse Y direction.

It is also possible, in using the ultrasonic elements 14*b*, 14*c* and 14*d* in an array, to make use of techniques already known per se for suppressing grating and side lobes. These known techniques comprise the so-called "sub-dicing" of elements for suppressing side lobes; the weighting of the presence amplitude of an element as a function of the position of said element in the array in a manner such that the contribution of the elements situated at both ends of the array is less heavily weighted than the contribution of the elements situated in the centre, as a result of which a further suppression of the side lobes is possible. If a number of arrays are used next to each other in the Y direction, such a weighting may also be carried out in the Y direction. A further method of attenuating the side lobes comprises making the absorption of an ultrasonic lens placed in front of the array position dependent; the partial etching-away of the electrodes of the elements in the direction of the edges thereof and the adjusting of the polarization of the elements to the position of the elements in the array.

Figure 2:
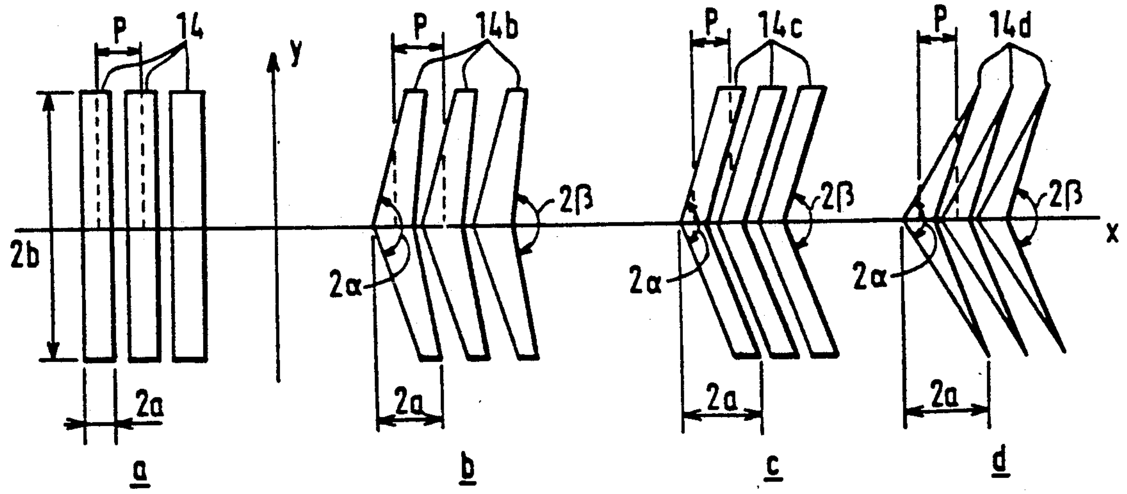

A possible procedure for manufacturing an array having ultrasonic elements according to FIGS. 2*b*, *c* or *d* comprises manufacturing two subtransducer arrays which are mirror images of each other with respect to the lateral centre axis of the array. In such a subtransducer, which, viewed in the plan view of FIG. 2, thus comprises the ultrasonic element sections above and below the X axis, the elements can be formed in a simple manner by separating the elements from each other in a bar of piezoelectric ceramic material having electrodes on either side and mounted on a carrier by means of sawing or by cutting with the aid of a laser and giving them the required form. The final array can then be formed by attaching the two subtransducers to each other.

Although the sections of the array on either side of the X axis are mirror images of each other in the embodiments described above, it is in principle also possible to displace these array parts with respect to each other in the X direction or even to use differently-shaped element parts on either side of the X axis.

I claim:

1. An ultrasonic transducer which comprises at least one row of ultrasonic elements having transverse side edges of consecutive elements extending obliquely with respect to a center axis (x) of said row of ultrasonic elements, each of said ultrasonic elements of a width in a lateral direction greater than a distance between central points of consecutive ultrasonic elements on said center axis of said row of ultrasonic elements.

2. The ultrasonic transducer as defined in claim 1 wherein said ultrasonic elements are symmetrical with respect to said center axis, said side edges of said ultrasonic elements being paired side surfaces forming an angle less than 90° with respect to said center axis.

3. The ultrasonic transducer as defined in claim 2 wherein said angle of paired side surfaces are equal.

4. The ultrasonic transducer as defined in claim 2 wherein all said paired side surfaces converge at one side of said center axis.

* * * * *